(12) United States Patent
Campbell

(10) Patent No.: US 9,583,699 B2
(45) Date of Patent: Feb. 28, 2017

(54) TUNABLE VARIABLE RESISTANCE MEMORY DEVICE

(71) Applicant: BOISE STATE UNIVERSITY, Boise, ID (US)

(72) Inventor: Kristy A. Campbell, Boise, ID (US)

(73) Assignee: BOISE STATE UNIVERSITY, Boise, ID (US)

( * ) Notice: Subject to any disclaimer, the term of this patent is extended or adjusted under 35 U.S.C. 154(b) by 25 days.

(21) Appl. No.: 14/962,378

(22) Filed: Dec. 8, 2015

(65) Prior Publication Data

US 2016/0351801 A1     Dec. 1, 2016

Related U.S. Application Data

(63) Continuation-in-part of application No. 14/727,618, filed on Jun. 1, 2015.

(51) Int. Cl.
*H01L 45/00*     (2006.01)

(52) U.S. Cl.
CPC ........ *H01L 45/085* (2013.01); *H01L 45/1233* (2013.01); *H01L 45/1266* (2013.01); *H01L 45/143* (2013.01); *H01L 45/144* (2013.01); *H01L 45/1608* (2013.01)

(58) Field of Classification Search
CPC ... H01L 45/141; H01L 45/1253; H01L 45/16; H01L 45/1233; G11C 13/0069
USPC .......................................................... 257/4
See application file for complete search history.

(56) References Cited

U.S. PATENT DOCUMENTS

| | | | |
|---|---|---|---|
| 6,849,868 B2 | 2/2005 | Campbell | |
| 6,867,996 B2 | 3/2005 | Campbell et al. | |
| 6,953,720 B2 | 10/2005 | Moore et al. | |
| 7,015,494 B2 | 3/2006 | Campbell | |
| 7,030,405 B2 | 4/2006 | Campbell | |
| 7,050,327 B2 | 5/2006 | Campbell | |
| 7,087,919 B2 * | 8/2006 | Campbell | H01L 45/085 257/2 |
| 7,190,048 B2 | 3/2007 | Campbell | |
| 7,282,783 B2 | 10/2007 | Campbell | |
| 7,326,950 B2 | 2/2008 | Campbell | |
| 7,329,558 B2 | 2/2008 | Campbell | |
| 7,332,735 B2 | 2/2008 | Campbell | |
| 7,348,209 B2 | 3/2008 | Campbell | |

(Continued)

OTHER PUBLICATIONS

Chua, Leon, If it's pinched it's a memristor, Semicond. Sci. Technol. 29 (2014) 104001 (42pp), Semiconductor Science and Technology, Published Sep. 18, 2014.

(Continued)

*Primary Examiner* — Fernando L Toledo
*Assistant Examiner* — Adam S Bowen
(74) *Attorney, Agent, or Firm* — Parsons Behle & Latimer

(57) ABSTRACT

A variable resistance memory device may include a first electrode and a second electrode. The device may further include a chalcogenide glass layer between the first electrode and the second electrode. The chalcogenide glass layer may include a chalcogenide glass material co-deposited with a metal material. The metal material may include tin. The device may also include a metal ion source structure between the chalcogenide glass layer and the second electrode. The device may include a buffer layer between the first electrode and the chalcogenide glass layer.

20 Claims, 3 Drawing Sheets

(56) References Cited

U.S. PATENT DOCUMENTS

| | | | |
|---|---|---|---|
| 7,354,793 B2 | 4/2008 | Campbell | |
| 7,387,909 B2 | 6/2008 | Campbell | |
| 7,518,212 B2 | 4/2009 | Moore et al. | |
| 7,723,713 B2 | 5/2010 | Campbell et al. | |
| 7,745,808 B2 | 6/2010 | Campbell | |
| 7,749,853 B2 | 7/2010 | Campbell | |
| 7,759,665 B2 | 7/2010 | Campbell | |
| 7,785,976 B2 | 8/2010 | Campbell | |
| 7,868,310 B2 | 1/2011 | Campbell | |
| 7,879,646 B2 | 2/2011 | Campbell | |
| 7,994,491 B2 | 8/2011 | Campbell | |
| 2003/0228717 A1* | 12/2003 | Li | C23C 14/0623 438/95 |
| 2005/0017233 A1 | 1/2005 | Campbell | |
| 2007/0007506 A1* | 1/2007 | Campbell | G11C 13/0011 257/2 |
| 2007/0023744 A1 | 2/2007 | Campbell et al. | |
| 2007/0045604 A1* | 3/2007 | Liu | H01L 45/04 257/2 |
| 2007/0059882 A1* | 3/2007 | Daley | H01L 27/24 438/257 |
| 2013/0128649 A1 | 5/2013 | Quick et al. | |
| 2013/0306927 A1* | 11/2013 | Marsh | H01L 45/06 257/2 |

OTHER PUBLICATIONS

US Patent and Trademark Office; Office Action for U.S. Appl. No. 14/727,618 dated Mar. 24, 2016.

International Searching Authority; International Search Report and Written Opinion for Application No. PCT/US2016/016003 dated Apr. 25, 2016.

\* cited by examiner

TUNABLE VARIABLE RESISTANCE MEMORY DEVICE

CROSS-REFERENCE TO RELATED APPLICATIONS

This application, filed under 35 U.S.C. §119, is a continuation-in-part from and claims the benefit of U.S. patent application Ser. No. 14/727,618 filed on Jun. 1, 2015, and entitled "Tunable Variable Resistance Memory Device," the contents of which are hereby incorporated by reference in their entirety.

FIELD OF THE DISCLOSURE

The present disclosure is generally related to tunable variable resistance memory devices, and more particularly to tunable ion-conduction variable resistance memory devices.

BACKGROUND

A typical variable resistance memory device, or memristor, may be "programmed" to have two logic states, such as a low resistance state (on-state) and a high resistance state (off-state). In order to program the memristor into a low resistance state, a potential difference may be applied across a memory stack of the memristor. The potential difference may form one or more conductive pathways through the memory device, thereby decreasing the resistance of the memristor. In order to program the memristor into a high resistance state, a reverse potential difference may be applied across the memory stack. The reverse potential difference may alter, eliminate, or reduce the one or more conductive pathways, increasing the resistance of the memristor. The programmed resistance may be permanent, or semi-permanent, until changed by another applied potential. To read the resistance state of the memristor, a smaller potential difference (e.g., a voltage that is insufficient to change the resistance state) may be applied to the memory stack and a resultant current may be measured to determine the resistance state.

U.S. Pat. No. 7,087,919, filed on Apr. 7, 2004 and entitled, "Layered Resistance Variable Memory Device and Method of Fabrication," describes an example of a variable resistance memory device that relies on ion conduction to alter a resistance of the device. The device has at least one layer of silver-selenide between a first chalcogenide glass layer and a conductive adhesion layer, which may also be a chalcogenide glass layer. When a potential difference is placed across the device, the silver may form one or more conductive channels through the chalcogenide glass layer, thereby altering a resistance of the device. U.S. Pat. No. 7,087,919 is hereby incorporated by reference in its entirety.

U.S. Pat. No. 7,190,048, filed on Jul. 19, 2004 and entitled "Resistance Variable Memory Device and Method of Fabrication," describes another example of a variable resistance memory device that includes a stack with at least one layer of tin-chalcogenide proximate a first chalcogenide glass layer. During a conditioning step, tin-selenide from the tin-chalcogenide layer is incorporated into the chalcogenide glass layer to form conducting channels. Movement of silver ions into or out of that conducting channel during subsequent programming forms a conductive pathway, which causes a detectable resistance change across the memory device. U.S. Pat. No. 7,190,048 is hereby incorporated by reference in its entirety.

One potential challenge associated with typical memristor devices is that when the memristor is in a low resistance state, a high current may be drawn through the memristor in response to an applied voltage potential. The high current may result in high power consumption, which may decrease the economic value, or feasibility, of using typical memristor devices for some applications such as high density arrays. The high current may also produce heat that may alter the chemical structure of the device stack. Another potential problem associated with typical memristors is that the dynamic range of programmable resistance may be limited. For example, the dynamic range of programmable resistance of a typical memristor may only enable binary resistance states (e.g., an on-state or an off-state). As such, typical memristors may not be suitable for applications that depend on multiple discrete states or a continuous range of states.

SUMMARY

Accordingly, the present disclosure sets forth a variable resistance memory device that substantially solves, reduces, or eliminates at least one of the above-noted drawbacks of existing devices.

In an embodiment, a variable resistance memory device includes a first electrode and a second electrode. The device further includes a chalcogenide glass layer between the first electrode and the second electrode. The chalcogenide glass layer includes a chalcogenide glass material co-deposited with a metal material. The device also includes a metal ion source structure between the chalcogenide glass layer and the second electrode. The device includes a buffer layer between the first electrode and the chalcogenide glass layer.

In an embodiment, the metal material may include chromium, tungsten, copper, cobalt, indium, or a combination thereof. The chalcogenide glass material may include germanium selenide. The buffer layer may include the chalcogenide glass material and may exclude the metal material.

In an embodiment, the metal ion source structure may include a first adhesion layer and a second adhesion layer. The metal ion source structure may further include a mobile metal layer between the first adhesion layer and the second adhesion layer. The first adhesion layer and the second adhesion layer may include the chalcogenide glass material. The metal layer may include silver. A thickness of the metal layer may be between 600 Å and 1000 Å. A thickness of the first adhesion layer and the second adhesion layer may be less than 200 Å.

In an embodiment, the device further includes a metal-chalcogenide layer between the chalcogenide glass layer and the metal ion source structure. The metal chalcogenide layer may include tin-selenide. A thickness of the metal chalcogenide layer may be between 750 Å and 1250 Å. A thickness of the chalcogenide glass layer may be between 250 Å and 350 Å. A thickness of the buffer layer may be between 50 Å and 150 Å.

In an embodiment, the device further includes another buffer layer between the chalcogenide glass layer and the metal ion source structure. Further, an electrical resistance between the first electrode and the second electrode may be programmable within the range of 10 kΩ and 1 MΩ. In some embodiments, an electrical resistance between the first electrode and the second electrode is programmable within the range of 10 kΩ and 100 kΩ.

In an embodiment, a variable resistance memory device includes a first electrode and a second electrode. The device further includes a chalcogenide glass layer between the first electrode and the second electrode. The chalcogenide glass layer includes germanium-telluride co-deposited with carbon. The device also includes a metal-chalcogenide layer between the chalcogenide glass layer and the second electrode. The device includes an ion source structure between the metal-chalcogenide layer and the second electrode. In an embodiment, the germanium-telluride is co-deposited with carbon using a co-sputtering process.

In an embodiment, a method of forming a variable resistance memory device includes forming a first electrode. The method further includes forming a buffer layer. The method also includes forming a chalcogenide glass layer by co-depositing a chalcogenide glass material and a metal material. The method includes forming an ion source structure. The method further includes forming a second electrode. In an embodiment, the method may further include forming a metal chalcogenide layer between the chalcogenide glass layer and the ion source structure. Further, in an embodiment forming the ion source structure includes forming a first adhesion layer, forming a mobile metal layer, and forming a second adhesion layer.

In an embodiment, a variable resistance memory device includes a first electrode and a second electrode. The device further includes a chalcogenide glass layer between the first electrode and the second electrode. The chalcogenide glass layer includes a chalcogenide glass material co-deposited with a metal material. In some embodiments, the metal material may include tin. The device also includes a metal ion source structure between the chalcogenide glass layer and the second electrode. The device includes a buffer layer between the first electrode and the chalcogenide glass layer.

The features, functions, and advantages that have been discussed can be achieved independently in various embodiments or may be combined in yet other embodiments further details of which can be seen with reference to the following description and drawings.

Figure 1:
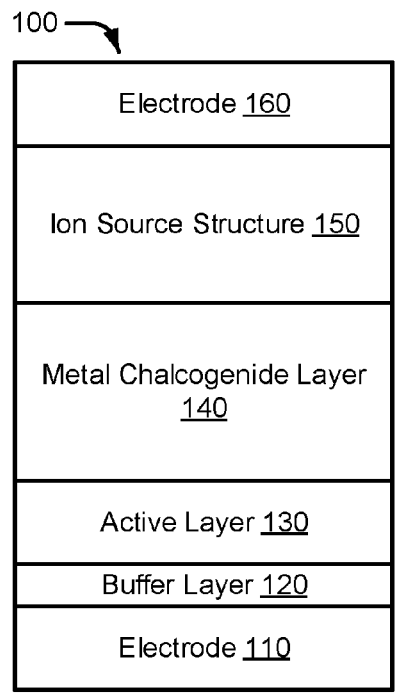
FIG. 1 is a block diagram depicting an embodiment of a variable resistance memory device including a chalcogenide glass active layer.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

A variable resistance memory device, or memristor, may rely on ion conduction through a chalcogenide glass, such as a $Ge_2Se_3$ type glass (e.g., $Ge_{40}Se_{60}$), to form conductive pathways within the chalcogenide glass, thereby altering an electrical property (e.g., a resistance) of the device. Modification or perturbation of the Ge—Ge bond found in the $Ge_2Se_3$ glass, or of a corresponding bond in another type of glass, may alter the ion conduction properties of the chalcogenide glass. The modification or perturbation of the Ge—Ge bonds may be induced by incorporating impurities in the chalcogenide glass. Consistent with this disclosure, U.S. patent application Ser. No. 14/457,400 filed on Aug. 12, 2014 and entitled, "Carbon-Chalcogenide Variable Resistance Memory Device," describes incorporating carbon into a germanium selenide chalcogenide glass. The carbon alters ion conduction properties of the germanium selenide. U.S. patent application Ser. No. 14/457,400 is incorporated by reference in its entirety.

The modification or perturbation may further be induced by incorporating metal impurities, in addition to an ion source metal used to form the conductive channels, into the glass at small concentrations. The incorporation of the metal may alter the number of Ge—Ge bond sites by allowing Ge-metal bonding, and, depending on the metal, may create or remove a pathway for conduction of the ion source metal. By incorporating the metals into the bond sites prior to incorporation of the ion source metal, the electrical properties of the device may be tuned. In an embodiment, a memristor includes a top electrode and a bottom electrode. The memristor also includes an ion source structure that includes an ion source metal. The memristor further includes a chalcogenide glass layer that is co-deposited with a material (e.g., a metal) that alters the electrical conduction through conductive channels between the ion source structure and the bottom electrode. Further, the memristor may include a buffer layer between the chalcogenide glass layer and the bottom electrode. The buffer layer may include the chalcogenide glass without the material (e.g., the metal).

Referring to FIG. 1, an embodiment of a variable resistance memory device is depicted and generally designated 100. The device 100 may include an electrode 110, a buffer layer 120, a chalcogenide glass active layer 130, a metal chalcogenide layer 140, an ion source structure 150, and an electrode 160. The device 100 may be formed as a part of an encompassing semiconductor device and/or may be coupled to other devices, layers, or structures. For example, the device 100 may be part of a memory array, a processing element, another type of semiconductor device, or combinations thereof.

The electrodes 110, 160 may be positioned on opposite ends of the device 100, such that a voltage potential between the electrodes 110, 160 may generate an electric field through the buffer layer 120, the active layer 130, the metal chalcogenide layer 140, and the ion source structure 150. Further, other devices may interact with the device 100 via voltage potentials at the electrodes 110, 160. For example, the electrodes 110, 160 may couple the device 100 to input pins, output pins, and/or other structures or devices to enable read, write, and erase operations as described herein. The electrodes 110, 160 may include any material capable of applying voltage potentials to the device 100. In some embodiments, the electrode 110, the electrode 160 or both include a conductive metal, such as tungsten. Further, in some embodiments, a thickness of the electrodes 110, 160 may be between about 300 Å and 500 Å. For example, the thickness of the electrodes 110, 160 may equal about 380 Å. The terms "between about" and "equal about" as used herein mean "between" and "equal," respectively, while allowing for manufacturing variances and/or variances due to environmental factors such as temperature or structural deformation that do not cause a material alteration to functionality.

The buffer layer 120 may be positioned between the active layer 130 and the electrode 110. The buffer layer 120 may prevent electrical shorting between the active layer 130 and the electrode 110. For example, conductive pathways may be formed within the active layer 130 as describe further herein. The buffer layer 120 may prevent the conductive pathways from coming in contact with the electrode 110. As such, the buffer layer 120 may enable the device 100 to operate in a higher resistance state than would be possible without the buffer layer 120. In an embodiment, the buffer layer 120 includes germanium-selenide (e.g., $Ge_{40}Se_{60}$) that has not been doped, or co-deposited, with a metal. In some embodiments, a thickness of the buffer layer 120 may be between about 50 Å and 150 Å. For example, the thickness of the buffer layer may equal about 100 Å. Although not depicted in FIG. 1, in some embodiments, an additional buffer layer may be included between the active layer 130 and the metal-chalcogenide layer 140.

The active layer 130 may be positioned between the buffer layer 120 and the metal chalcogenide layer 140. Further, the metal-co-deposited-glass layer 130 may include one or more metals co-deposited with a chalcogenide glass. For example, the one or more metals may include chromium, tungsten, copper, cobalt, indium another metal, or combinations thereof. The chalcogenide glass may include germanium-selenide (e.g., $Ge_{40}Se_{60}$). The metal may alter the formation of conductive channels within the chalcogenide glass. For example, the metal may occupy Ge—Ge bond sites within the chalcogenide glass and thereby alter the ability of metal ions (e.g., ions received from the ion source structure 150) to occupy the bond sites. As such, the active layer 130 may enable tuning of a resistance exhibited by the device 100. In some embodiments, a thickness of the active layer 130 may be between about 250 Å and 350 Å. For example, the thickness of the active layer 130 may equal about 300 Å.

The metal chalcogenide layer 140 may be positioned between the ion source structure 150 and the active layer 130. A metal from the metal-chalcogenide layer 140 may be incorporated into the active layer 130, during operation, to form conducting channels. Movement of metal ions from the ion source structure 150 into or out of the active layer 130 may be facilitated by the conducting channels. In an embodiment, the metal chalcogenide layer includes tin-selenide (e.g., SnSe). A thickness of the metal chalcogenide layer 140 may be between about 750 Å and 1250 Å. For example, the thickness of the metal chalcogenide layer 140 may equal about 1000 Å.

The ion source structure 150 may be positioned between the metal chalcogenide layer 140 and the electrode 160 and may provide metal ions for the creation of conductive pathways through the active layer 130. For example, the ion source structure 150 may include a mobile metal, such as silver or copper, that may migrate through the metal chalcogenide layer 140 into the active layer 130. The ion source structure 150 may further include one or more adhesion layers to enable migration of the metal ions and/or assist with the formation of the ion source structure 150. In an embodiment, the ion source structure is between about 600 Å and 1000 Å. For example, the thickness of the ion source structure may equal about 750 Å.

During operation, the device 100 may rely on ion conduction to alter an electrical resistance of the device 100. In the presence of a voltage potential during a conditioning operation, metal (e.g., tin) from the metal chalcogenide layer 140 may migrate to the active layer 130. The migrated metal may occupy bond sites (e.g. Ge—Ge bond sites) within the glass of the active layer 130. The metal from the metal chalcogenide layer 140 facilitates ionic conduction within the active layer 130. In the presence of a voltage potential, the metal ions may flow from the ion source structure 150 to the active layer 130 to form electrically conductive pathways within the active layer 130. The electrically conductive pathways may alter or decrease an electrical resistance of the active layer 130. When the voltage potential is removed, the conductive pathways may remain until a reverse voltage potential is applied. For example, the device 100 may be used as a non-volatile or semi-non-volatile memory device.

In the presence of a reverse voltage potential, the metal ions may flow from the active layer 130 back to the ion source structure 150. The conductive pathways within the active layer 130 may be altered or reduced with fewer metal ions. As the conductive pathways within the active layer 130 are altered or reduced, a resistance of the active layer may be increased. When the reverse voltage potential is removed, the increased resistance may remain until again changed via a voltage potential.

The co-sputtered metal, already present within the active layer 130, may occupy a portion of the bond sites within the glass material of the active layer 130. As such, the co-sputtered metal may impede the migration of the metal from the metal chalcogenide layer 140 to the active layer 130 and further impede ionic conduction within the active layer 130. In that way, the co-sputtered metal may limit the extent to which the metal ions from the ion source structure 150 form electrically conductive pathways within the active layer 130. Because the electrical resistance of the active layer 130 depends on the electrically conductive pathways, the change or decrease in the electrical resistance of the active layer 130 may be more moderate as compared to an active layer 130 that does not include a co-sputtered metal. Alternatively, some metals may have the opposite effect such that the change or decrease in the electrical resistance of the active layer 130 may be less moderate as compared to an active layer 130 that does not include a co-sputtered metal.

In an embodiment, the device 100 may further rely on a phase change of the active layer 130 to alter the electrical resistance of the device 100 in addition to ion conduction. For example, as electrical current and/or ionic current passes through the active layer 130, the glass of the active layer 130 may be subjected to a phase change. The current may be timed to achieve a particular resistance of the active layer 130. As current passes through the active layer 130, the co-sputtered metal of the active layer may change phase between amorphous and crystalline phases. For example, the co-sputtered metal active layer 130 may be capable of crystallizing through a phase change mechanism when it is heated via current passing through it. As such, the co-sputtered metal may be used to tune the device 100 to a particular range of resistances that would not be feasible in memristors that do not include the co-sputtered metal.

A benefit associated with the device 100 is that by having an active layer 130 that includes one or more co-deposited metals a programmable range of resistances of the device

100 may be tuned for particular applications. To illustrate, a resistance of the device 100 (e.g., between the electrodes 110, 160) may be programmable within the range of 10 kΩ to 1 MΩ. Stable values may be achieved up to the 100 kΩ range. Because of the higher resistance range, when the device is in a low resistance state, a current drawn through the device 100 in response to an applied voltage potential may be advantageously lowered as compared to typical memristor devices. The lower current may result in lower power consumption at the device 100 and may reduce heating within the device. Further, because the device 100 allows for multiple resistance states, a dynamic range of programmable resistance may be greater as compared to typical memristor devices.

Figure 2:
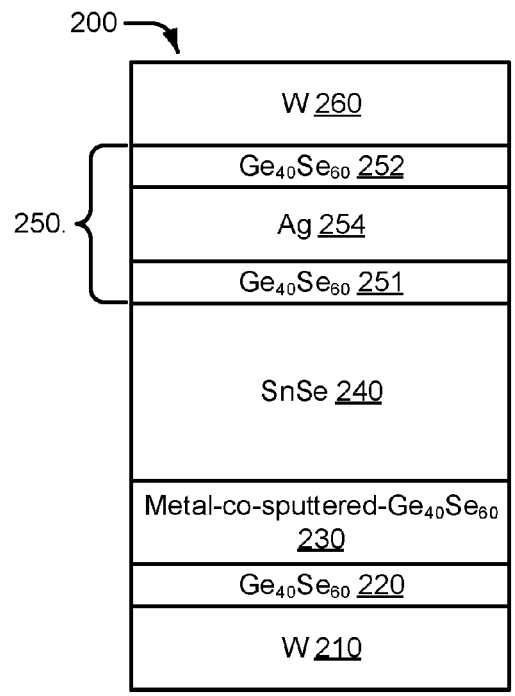
FIG. 2 is a block diagram depicting an embodiment of a variable resistance memory device including a metal-co-sputtered-germanium-selenide layer.

Referring to FIG. 2, a block diagram depicting an embodiment of a variable resistance memory device 200 including a metal-co-sputtered-germanium-selenide layer is depicted. The device 200 may include an electrode 210, a buffer layer 220, an active layer 230, a metal-chalcogenide layer 240, an ion source structure 250, and an electrode 260. The electrodes 210, 260 may include a conductive metal, such as tungsten and may apply a voltage potential through the buffer layer 220, the active layer 230, the metal-chalcogenide layer 240, and the ion source structure 250 as described herein.

The buffer layer 220 and the active layer 230 may include germanium-selenide (e.g., $Ge_{40}Se_{60}$). The active layer 230 may further be doped with a metal. For example, the metal and the germanium-selenide may be co-sputtered to form the active layer 230. Alternatively, other doping techniques may be used to form the active layer 230. The metal may include chromium, tungsten, copper, cobalt, indium, another metal, or combinations thereof.

The metal chalcogenide layer 240 may include tin-selenide (e.g., SnSe). The tin from the tin-selenide may migrate into the active layer 230 and occupy Ge—Ge bond sites within the germanium-selenide. The migration may enable or facilitate the introduction of ions from the ion source layer 250 to the active layer 230.

The ion source structure 250 may include an adhesion layer 251 that includes germanium-selenide, a metal layer 254 that includes silver, and another adhesion layer 252 that includes germanium-selenide. The adhesion layers 252, 256 may contain and adhere the metal layer 254 to the rest of the device 200. In an embodiment, the metal layer 254 has a thickness of between about 600 Å and 1000 Å. For example, the thickness of the ion source structure may equal about 750 Å. The thickness of the adhesion layers 251, 252 may be less than 200 Å.

After deposition, the metal in the active layer 230 may occupy a portion of the bond sites within the germanium-selenide. By occupying the bond sites, the metal may impede the migration of tin from the metal chalcogenide layer 240 to the active layer 230 and further impede ionic conduction within the active layer 230. In that way, the metal may limit the extent to which silver ions from the ion source structure 250 form electrically conductive pathways within the active layer 230. As such, an operational resistance of the device 200 may be tuned and may have higher resistances as compared to memristors that do not include a metal within the active layer 230. Alternatively, as described herein, depending on the metal used, an operational resistance of the device 200 may have lower resistances as compared to memristors that do not include the metal within the active layer 230. As such, the device 200 may be tuned for use in particular applications, as described herein.

Figure 3:
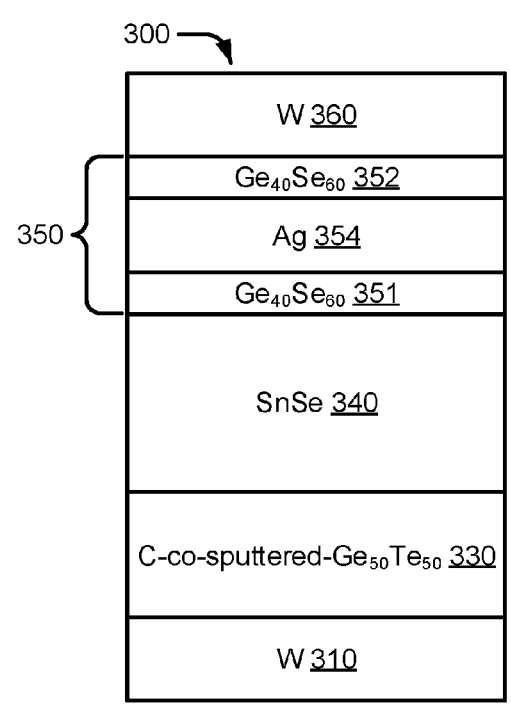
FIG. 3 is a block diagram depicting an embodiment of a variable resistance memory device including a carbon-co-sputtered-germanium-telluride layer.

Referring to FIG. 3, a block diagram depicting an embodiment of a variable resistance memory device 300 where an active layer includes carbon co-sputtered with germanium-telluride is depicted. The device 300 may include an electrode 310, an active layer 330, a metal chalcogenide layer 340, an ion source structure 350, and an electrode 360. Carbon and germanium-telluride may be co-sputtered to form the active layer 330. Alternatively, other doping techniques may be used to form the active layer 330. The metal chalcogenide layer 340 may include tin-selenide (e.g., SnSe). The ion source structure 350 may include an adhesion layer 351 that includes germanium-selenide, a metal layer 354 that includes silver, and another adhesion layer 352 that includes germanium-selenide. The electrode 360 may include tungsten.

After deposition, the carbon from the active layer 330 may occupy Ge—Ge bond sites within the germanium-telluride of the active layer 330. By occupying the bond sites, the carbon may impede the migration of tin from the metal chalcogenide layer 340 to the active layer 330 and further impede ionic conduction within the active layer 330. In that way, the metal may limit the extent to which silver ions from the ion source structure 350 form electrically conductive pathways within the active layer 330. As such, an operational resistance of the device 300 may be tuned and may have higher resistances as compared to memristors that do not include a metal within the active layer 330. Alternatively, as described herein, depending on the metal used, an operational resistance of the device 300 may have lower resistances as compared to memristors that do not include carbon within a germanium-telluride active layer 230. As such, the device 300 may be tuned for use in particular applications, as described herein.

Figure 4:
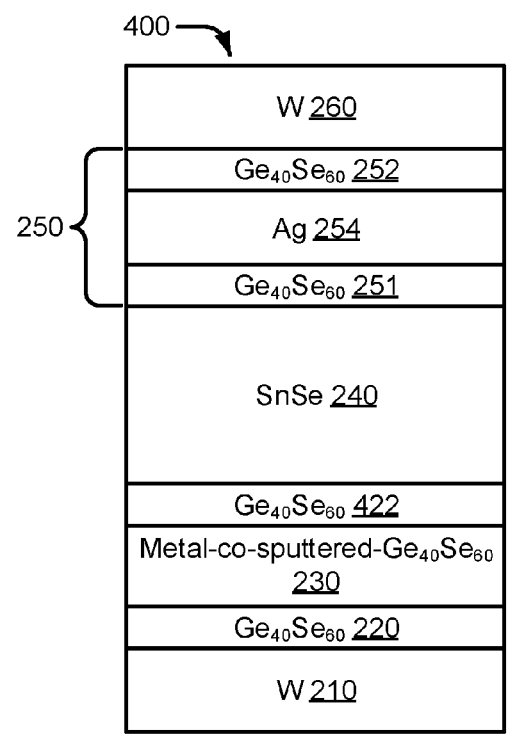
FIG. 4 is a block diagram depicting an embodiment of a variable resistance memory device including multiple buffer layers.

Referring to FIG. 4, a block diagram depicting an embodiment of a variable resistance memory device 400 with multiple buffer layers is depicted. The device 400 may include the electrodes 210, 260, the buffer layer 220, the metal-co-sputtered active layer 230, the metal-chalcogenide layer 240, and the ion source structure 250. The embodiment of FIG. 4 may further include another buffer layer 422. The other buffer layer 422 may be positioned between the active layer 230 and the metal-chalcogenide layer 240. In the embodiment of FIG. 4, the other buffer layer 422 may include a layer of germanium-selenide that is not co-deposited with the same metal as the active layer 230. The other buffer layer 240 may enable better tuning of the device 400.

Figure 5:
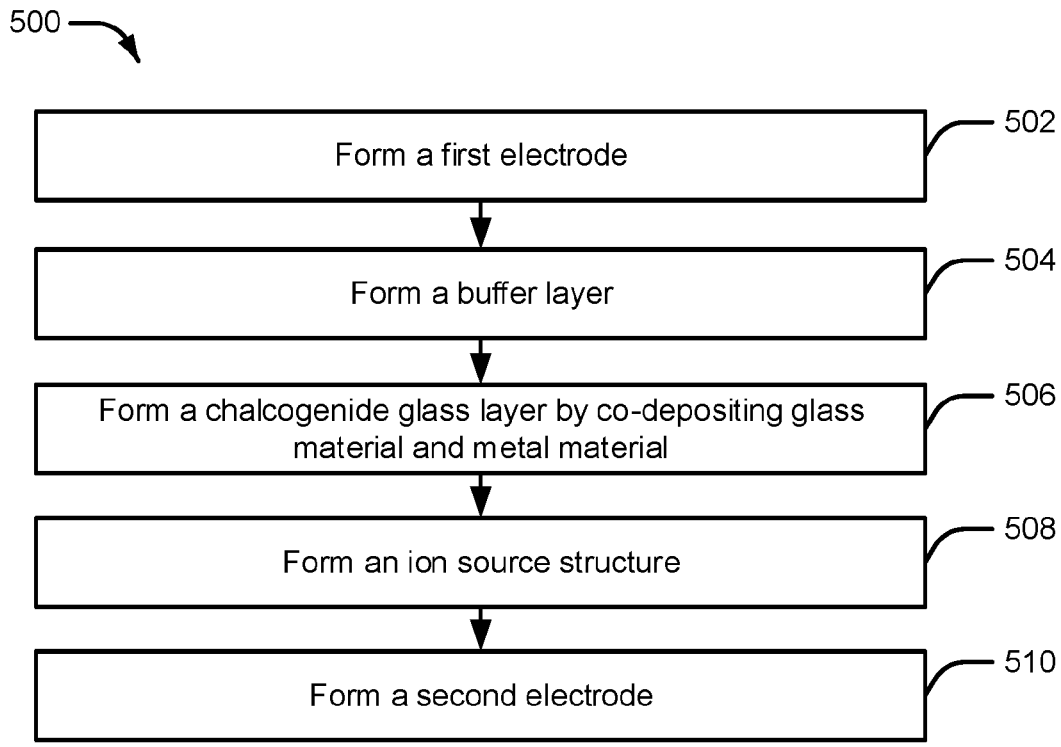
FIG. 5 is a flow chart depicting an embodiment of a method of forming a variable resistance memory device including a chalcogenide glass active layer.

Referring to FIG. 5, a flow chart depicting an embodiment of a method 500 of forming a variable resistance memory device wherein an active layer includes a metal is depicted. The method 500 may include forming a first electrode, at 502. For example, one or more of the electrodes 110, 210 may be formed by depositing a conductive material on a semiconductor wafer.

The method 500 may also include forming a buffer layer, at 504. For example, one or more of the buffer layers 120, 220 may be formed by depositing a glass material on the electrodes 110, 210.

The method 500 may further include forming an active layer by co-sputtering a metal material with a glass material, at 506. For example, the one or both of the active layers 130, 230 may be formed by co-sputtering a metal with germanium-selenide.

The method 500 may also include forming an ion source structure, at 408. For example, one or more of the ion source structures 150, 250 may be formed by depositing a first glass layer (e.g., the glass layer 251), forming a metal layer (e.g., the metal layer 254), and forming a second glass layer (e.g., the glass layer 252).

The method 500 may include forming a second electrode, at 510. For example, one or more of the electrodes 160, 260 may be formed by depositing a conductive material (e.g., tungsten) on the wafer.

Although not depicted in FIG. 5, the method 500 may include one or more additional processes, such as one or more deposition process or one or more etching process. Further, additional layers and structures (e.g., insulating layers, metal routing layers, via structures, and spacer structures) may be formed on or between the layers described herein.

Figure 6:
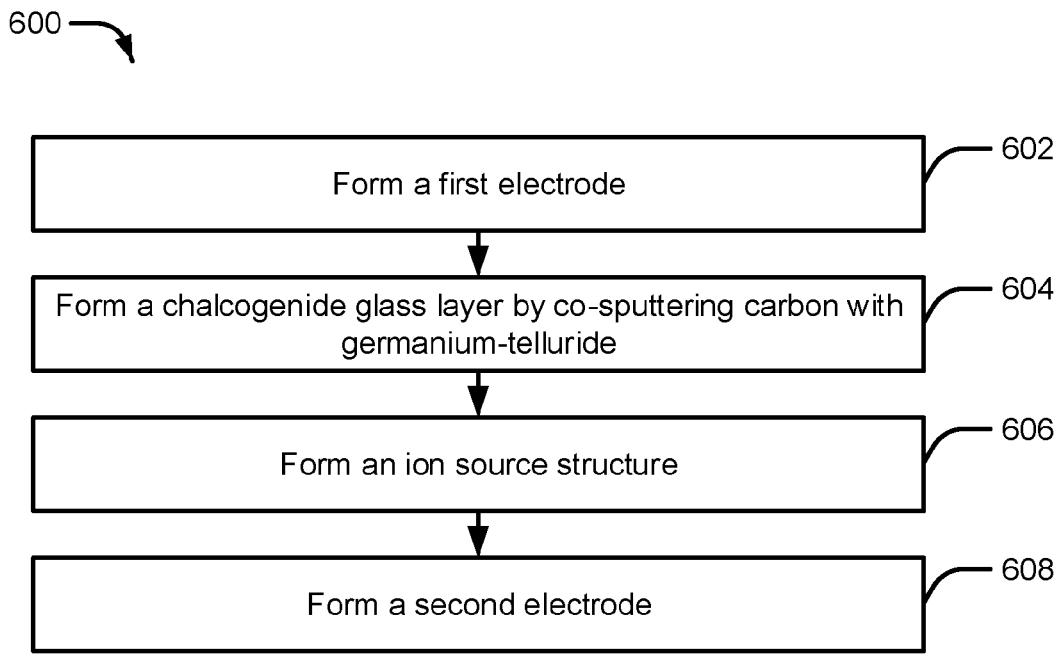
FIG. 6 is a flow chart depicting an embodiment of a method of forming a variable resistance memory device including a carbon-co-sputtered-germanium-telluride layer.

Referring to FIG. 6, a flow chart depicting an embodiment of a method 600 of forming a variable resistance memory device where an active layer includes germanium-telluride is depicted. The method 600 may include forming a first electrode, at 602. For example, the electrodes 310 may be formed by depositing a conductive material on a semiconductor wafer.

The method 600 may further include forming an active layer by co-sputtering carbon with germanium-telluride, at 604. For example, the active layer 330 may be formed by co-sputtering carbon with germanium-telluride. Alternatively, one or more other doping process may be used to introduce the carbon into the germanium-telluride.

The method 600 may also include forming an ion source structure, at 606. For example, the ion source structure 350 may be formed by forming a depositing a first glass layer (e.g., the glass layer 351), forming a metal layer (e.g., the metal layer 354), and forming a second glass layer (e.g., the glass layer 356).

The method 600 may include forming a second electrode, at 608. For example, the electrodes 360 may be formed by depositing a conductive material (e.g., tungsten) on the wafer.

In accordance with the systems and methods described herein, tin may be particularly effective in altering the formation of conductive channels within the chalcogenide glass due to the particular physical and chemical properties of the tin. In particular, the inclusion of tin may enable the electrical properties of the device to be modulated as opposed to other types of metals. The resistance ranges, switching speeds, and data retention may be affected by this change in the active glass layer. As such, an active layer that includes tin may be more effective in enable the tuning of a resistance exhibited by a device in some applications than embodiments that do not include tin within the active layer.

Figure 7:
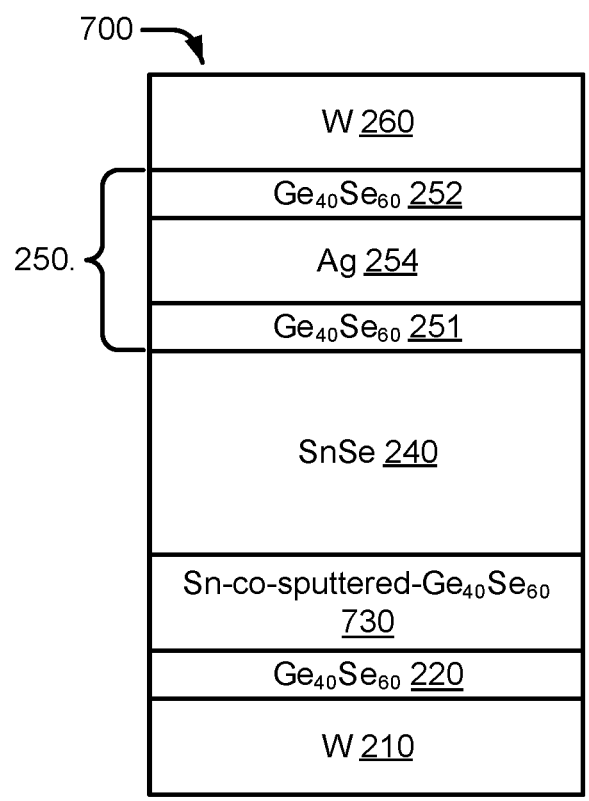
FIG. 7 is a block diagram depicting an embodiment of a variable resistance memory device where a metal in the active layer includes tin.

As explained above, referring to FIG. 1, the metal-co-deposited-glass layer 130 may include one or more metals co-deposited with a chalcogenide glass. In some embodiments, the one or more metals may include tin. Likewise, referring to FIGS. 2 and 4, the active layer 230 may include germanium-selenide co-sputtered (or otherwise doped) with tin. Referring to FIG. 7, a block diagram depicting an embodiment of a variable resistance memory device 700 where at least one metal within an active layer 730 includes tin is depicted.

Although various embodiments have been shown and described, the present disclosure is not so limited and will be understood to include all such modifications and variations as would be apparent to one skilled in the art having the benefit of this disclosure. Further, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A variable resistance memory device comprising:
   a first electrode and a second electrode;
   a chalcogenide glass layer between the first electrode and the second electrode, the chalcogenide glass layer including a chalcogenide glass material co-deposited with a metal material;
   a metal ion source structure between the chalcogenide glass layer and the second electrode;
   a metal chalcogenide layer between the chalcogenide glass layer and the metal ion source structure;
   a buffer layer between the first electrode and the chalcogenide glass layer, wherein the buffer layer includes the chalcogenide glass material and excludes the metal material; and
   a second buffer layer between the chalcogenide glass layer and the metal chalcogenide layer.

2. The device of claim 1, wherein the metal material includes tin.

3. The device of claim 2, wherein the metal material includes chromium, tungsten, copper, cobalt, indium, or a combination thereof.

4. The device of claim 1, wherein the chalcogenide glass material includes germanium selenide.

5. The device of claim 1, wherein the metal ion source structure includes:
   a first adhesion layer and a second adhesion layer; and
   a mobile metal layer between the first adhesion layer and the second adhesion layer.

6. The device of claim 5, wherein the first adhesion layer and the second adhesion layer include the chalcogenide glass material.

7. The device of claim 6, wherein the mobile metal layer includes silver and wherein the second buffer layer includes the chalcogenide glass material and excludes the metal material.

8. The device of claim 7, wherein the chalcogenide glass material includes germanium selenide.

9. The device of claim 5, wherein the metal layer includes silver.

10. The device of claim 1, wherein the metal chalcogenide layer includes tin-selenide.

11. The device of claim 1, wherein a thickness of the metal chalcogenide layer is between 750 Å and 1250 Å.

12. The device of claim 1, wherein a thickness of the chalcogenide glass layer is between 250 Å and 350 Å.

13. The device of claim 1, wherein an electrical resistance between the first electrode and the second electrode is programmable within the range of 10 k$\Omega$ and 1 M$\Omega$.

14. The device of claim 1, wherein an electrical resistance between the first electrode and the second electrode is programmable within the range of 10 k$\Omega$ and 100 k$\Omega$.

15. The device of claim 1, wherein the second buffer layer includes the chalcogenide glass material and excludes the metal material.

16. The device of claim 15, wherein the chalcogenide glass material includes germanium selenide.

17. A method of forming a variable resistance memory device, the method comprising:
   forming a first electrode;
   forming a buffer layer;
   forming a chalcogenide glass layer by co-depositing a chalcogenide glass material and a metal material, wherein the buffer layer is formed between the first electrode and the chalcogenide glass layer and the buffer layer includes the chalcogenide glass material and excludes the metal material;

forming a second buffer layer, wherein the chalcogenide glass layer is formed between the buffer layer and the second buffer layer;

forming a metal chalcogenide layer, wherein the second buffer layer is formed between the chalcogenide glass layer and the metal chalcogenide layer;

forming an ion source structure, wherein the metal chalcogenide layer is formed between the ion source structure and the second buffer layer; and forming a second electrode, wherein the ion source structure is formed between the second electrode and the metal chalcogenide layer.

18. The method of claim 17, wherein the metal material includes tin.

19. The method of claim 17, wherein the metal material further includes a metal selected from the group consisting of chromium, tungsten, and copper, cobalt, indium, and combinations thereof.

20. The method of claim 17, wherein forming the ion source structure comprises:
forming a first adhesion layer;
forming a metal layer; and
forming a second adhesion layer.

* * * * *